(12) United States Patent
Anjum et al.

(10) Patent No.: US 6,482,719 B1
(45) Date of Patent: Nov. 19, 2002

(54) SEMICONDUCTOR FIELD REGION IMPLANT METHODOLOGY

(75) Inventors: Mohammed Anjum, Travis County, TX (US); Alan L. Stuber, Travis County, TX (US); Maung H. Kyaw, Travis County, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 1810 days.

(21) Appl. No.: 08/526,149

(22) Filed: Aug. 2, 1995

Related U.S. Application Data

(63) Continuation of application No. 08/253,411, filed on Jun. 3, 1994, now abandoned.

(51) Int. Cl.[7] .............................................. H01L 21/30

(52) U.S. Cl. ..................................................... 438/449

(58) Field of Search .............. 437/69, 70; 148/DIG. 85, 148/DIG. 86, DIG. 117; 257/652; 438/449

(56) References Cited

U.S. PATENT DOCUMENTS

| 4,835,112 A | 5/1989 | Pfiester et al. |
| 5,108,954 A | 4/1992 | Sandhu et al. |

FOREIGN PATENT DOCUMENTS

| JP | 547922 | * 2/1993 | ................... 437/69 |

OTHER PUBLICATIONS

Baker et al., "The Influence of Flourine on Threshold Voltage Instabilities in P+ Polysilicon gated P–Channel MOSFETs," *IEDM*, (1989), pp. 443–446.
Yoon et al., "MOS Characteristics of $NH_3$–Nitrided $N_2O$–Grown Oxides," *IEEE*, (1993), pp. 179–181.
Sung et al., "A Comprehensive Study on $p^+$ Polysilicon––Gate MOSFET's Instability with Fluorine Incorporation," *IEEE*, (1990), pp. 2312–2320.
Lin et al., "The Effect of Fluorine on MOSFET Channel Length," *IEEE*, (1993), pp. 469–471.
Pfiester et al., "Improved MOSFET Short–Channel Device Using Germanium Implantation," *IEEE*, (1988), pp. 343–346.
Acovic et al., "Arsenic Source and Drain Implant Induced Degradation of Short–Channel Effects in NMOSFET's," *IEEE*, (1993), pp. 345–347.
Panteleev et al., "Influence of Elastic Stresses on Diffusion Processes in Semiconductors," *Sov. Phys. Solid State* 20(2), (Feb. 1978), pp. 324–325.

(List continued on next page.)

*Primary Examiner*—George Fourson
(74) *Attorney, Agent, or Firm*—Robert C. Kowert

(57) ABSTRACT

An MOS device is provided having a channel-stop implant placed between active regions and beneath field oxides. The channel-stop dopant material is a p-type material of atomic weight greater than boron, and preferably utilizes solely indium ions. The indium ions, once implanted, have a greater tendency to remain in their position than boron ions. Subsequent temperature cycles caused by, for example, field oxide growth do not significantly change the initial implant position. Thus, NMOS devices utilizing indium channel-stop dopant can achieve higher pn junction breakdown voltages and lower parasitic source/drain-to-substrate capacitances. Furthermore, the heavier indium ions can be more accurately placed than lighter boron ions to a region just below the silicon layer which is to be consumed by subsequent field oxide growth. By fixing the peak concentration density of indium at a depth just below the field oxide lower surface, channel-stop implant region is very shallow. Small dispersions in range allow for more precise control of the indium atoms just below the field oxide, further from the inner bulk material of the underlying substrate.

15 Claims, 3 Drawing Sheets

OTHER PUBLICATIONS

Sadana et al., "Enhanced Short–Channel Effects in NMOSFETs Due to Boron Redistribution Induced by Arsenic Source and Drain Implant," *IEDM,* (1992), pp. 849–852.

Wright et al., "The Effect of Fluorine in Silicon Dioxide Gate Dielectrics," *IEEE,* (1989), pp. 879–889.

Hsieh et al., "Characteristics of MOS Capacitor of $BF_2$ or B Implanted Polysilicon Gate with and without $POCl_3$ Co–doped," *IEEE,* (1993), pp. 222–224.

Ng et al., "Suppression of Hot–Carrier Degradation in Si MOSFET's by Germanium Doping," *IEEE,* (1990), pp. 45–47.

Sung et al., "Fluorine Effect on Boron Diffusion of P+ Gate Devices," *IEDE,* (1989), pp. 447–450.

Wolfe, "Silicon Processing for the VLSI Era", vol. 2: Process Integration (Lattice Press, 1990), pp. 20–22.

* cited by examiner

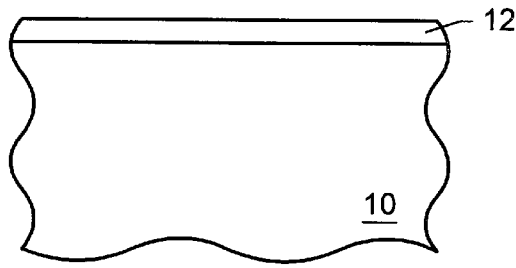
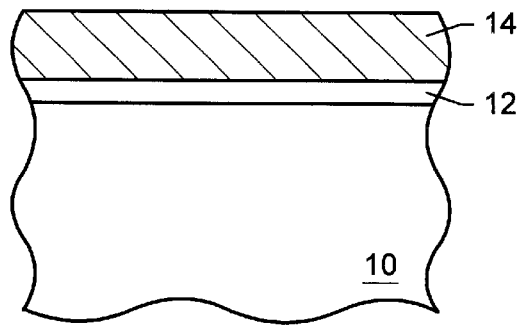
FIG. 1  FIG. 2
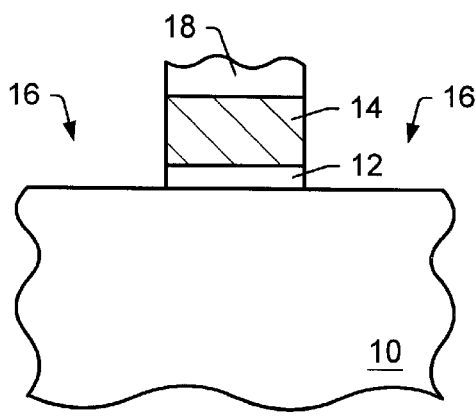
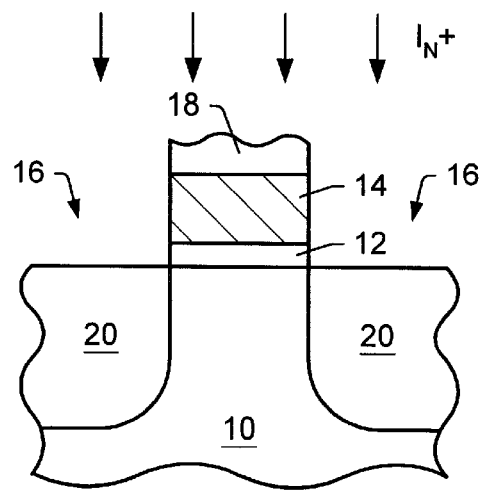
FIG. 3  FIG. 4
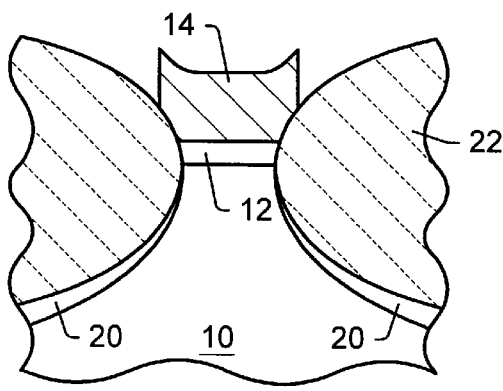
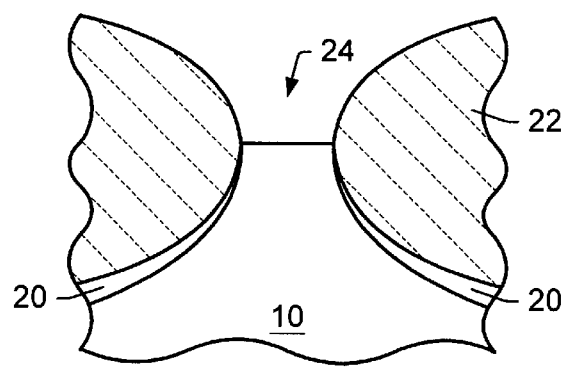
FIG. 5  FIG. 6

SEMICONDUCTOR FIELD REGION IMPLANT METHODOLOGY

This application is a continuation of application Ser. No. 08/253,411, filed Jun. 3, 1994 now abandoned.

BACKGROUND OF THE INVENTION

1. Field of the Invention

This invention relates to semiconductor processing and more particularly to a p-type field region implant which substantially maintains its position during subsequent temperature cycles relative to adjacent n-type source and drain regions.

2. Description of the Relevant Art

Fabrication of a MOSFET device is well known. Generally speaking, MOSFETs are manufactured by placing an undoped polycrystalline material or "polysilicon" material over a relatively thin gate oxide, and implanting the polysilicon and adjacent source/drain regions with an impurity dopant material. If the impurity dopant material is n-type, then the resulting MOSFET is an NMOSFET ("NMOS") device. Conversely, if the impurity dopant material is p-type, then the resulting MOSFET device is a PMOSFET ("PMOS") device.

There are numerous MOSFETs devices spaced across a single piece of silicon. Each device must be electrically isolated from other devices. Generally speaking, MOSFETS are self-isolated, as long as the source-substrate and drain-substrate pn junctions are held in reverse bias. The self-isolation property of MOSFETs devices represents a substantial area savings for NMOS and PMOS circuits compared to junction-isolated bipolar circuits.

Once the NMOS (and/or PMOS) devices are formed in silicon, they must then be interconnected by metal conductors placed across oxide in regions between the devices. Oxide formed between active devices is generally referred to as "field oxide". Field oxide is distinguishable from "gate oxide" in that gate oxide is formed in the active regions between source and drain and between polysilicon gate and underlying silicon.

The metal or poly conductors extending over field oxide often carry significant voltage levels. It is important that the conductor voltage not activate the parasitic channel regions underlying field oxide. The threshold voltage in the field region underlying the field oxides must therefore be kept higher than any possible operating voltage on the overlying conductors. One way in which to prevent channels in the field region. is to increase the thickness of the field oxide. Unfortunately, thick field oxide can present large disparities in the upper surface elevation leading to poor planarization and possible step coverage problems. Another, more suitable way in which to maximize field region threshold voltage is to implant the field region prior to field oxide growth. The field region can be implanted with a dopant type matching that of the underlying substrate (or tub). Implantation of the field region is often referred to as "channel-stop implant". The combination of channel-stop implant with adequate field oxide thickness can provide isolation for PMOS or NMOS devices to prevent channel formation in the field region.

The field oxide must be selectively grown only in the field regions and not in the active regions in which the active channels of the MOSFETs are formed. A popular method in which to selectively grow field oxide is often referred to as local oxidation of silicon ("LOCOS"). LOCOS methodology begins by covering the active regions with a thin layer of silicon nitride which prevents oxidation from occurring beneath the nitride. After the nitride layer has been etched away in the field regions, and prior to field oxide growth, the silicon in the field regions is selectively implanted with the channel-stop dopant. Thus, the field or channel-stop region becomes self-aligned to the field oxide.

Growth of field oxide can often present step-coverage limitation, and can be overcome to some degree by a selective oxidation approach. If the silicon is etched after the nitride layer is patterned, the field oxide can then be grown until it forms a planar surface with the silicon substrate. Etch-back of silicon in the field regions is often referred to as the "fully recessed" isolation oxide process. If the field oxide is grown without prior etch-back, the resulting field oxide will only be "partially (or semi) recessed". In the semi recessed process, the field oxide step height is larger than in the fully recessed process, but nonetheless, has a gentle upward slope from the silicon juncture area, some of which is consumed by oxide growth. Consumption of silicon during oxide growth provides a gentle upward slope at the outer edge of the areas in which nitride is removed. Thus, the edges of the field oxide slope upward at their juncture with the edge of the nitride layer.

While channel-stop implant in the field region is necessary to prevent channel formation therein, conventional channel-stop implant can, in and of itself, present problems. In NMOS circuits, a p-type implant of boron is generally used in the field region. After field oxide growth, boron is supposed to reside primarily below the field oxide. Unfortunately, due to the high diffusivity of boron (i.e., due to its small atomic weight and size), implanted boron atoms readily segregate and move laterally toward adjacent arsenic-implanted source and drain regions. Boron atoms may also diffuse into the growing field oxide or deeper within the substrate. Lateral (diffusion parallel to the substrate upper surface) or non-lateral (diffusion perpendicular to the substrate upper surface) is primarily caused by heat cycles occurring after boron is initially placed. Heat cycles occur during field oxide growth and are a necessary part of that growth.

Any segregation or diffusion of boron from its implanted area laterally to adjacent n-type (arsenic) source and drain regions can cause high source/drain-to-substrate (or tub) capacitances and/or reduction in source/drain-to-substrate (or tub) n+p junction breakdown voltages. See, e.g., Wolf, "Silicon Processing for the VLSI Era", Volume 2: Process Integration (Lattice Press, 1990), pp. 20–22. Generally speaking, breakdown voltage is inversely proportional to the doping concentration of the lighter-doped side of the p+n junction. Thus, increasing the doping of the p-type substrate (or tub) will reduce the breakdown voltage of the n-type source and drain regions adjoining the substrate. Source/drain-to-substrate capacitances are directly proportional to the doping concentration of the lighter-doped side. Increasing the doping of the p-type substrate will increase the parasitic capacitance of the source and drain regions leading to slower operation.

As described in Wolf, conventional research into minimizing lateral and non-lateral diffusion has focused primarily upon the field oxide step. Using high pressure oxidation ("HIPOX") to grow the field oxide allows the oxide growth temperature to be reduced thereby reducing the diffusion length of boron. Research effort has also focused upon co-implanting germanium ions with boron ions to exploit the fact that boron diffuses with a low diffusivity in the presence of implanted germanium. By lowering the growth temperature of field oxide and/or co-implanting germanium with boron, research appears to indicate an increase in field threshold voltage with the same or lower dosage of boron.

Instead of merely depositing boron at high concentrations necessary to offset any lateral diffusions or at deep depths in order for the ions not to be absorbed by the growing field oxide, researchers point to changing the field oxide growth step or co-implanting germanium. Using HIPOX to grow the field oxide requires the oxide growth chamber be retrofitted with pressure equipment. Retrofitting the oxide chamber can oftentimes be costly. Moreover, each wafer run requires the oxide chamber to be pressurized and then de-pressurized leading to lower wafer throughput. If the chamber is under pressure during oxide growth, disturbance of and ingress of unwanted particles can occur. Still further, if germanium is co-implanted with boron, boron must be implanted as the source material followed by germanium implantation. The two step implant process can further decrease wafer throughput and add to the complexity of implant source retrofit.

It would be advantageous to avoid retrofit of the wafer fabrication line. Specifically, maximum throughput entails a single implant step with non-pressurized field oxide growth. P-type channel-stop implant with minimal lateral and non-lateral diffusivity is a target outcome yet to be achieved by existing wafer fabrication equipment and process flow.

SUMMARY OF THE INVENTION

The problems outlined above are in large part solved by the field region or channel-stop region implant methodology of the present invention. Instead of using boron (a mainstay in conventional NMOS channel-stop implants), the present invention utilizes indium implant. Indium, being of larger atomic mass and weight than boron, has a greater tendency to remain in its implanted position than that of boron. Specifically, indium can be implanted at a more controlled elevational depth in the field region than conventional boron. Indium is optimally implanted just below the silicon consumed by field oxide growth. Thus, indium is purposefully placed in a shallow region just below the resulting field oxide. Once placed, indium remains at or near its initial implant position and does not segregate and migrate to a substantial extent. Accordingly, indium does not diffuse laterally and non-laterally to the extent boron does and therefore will not cause high source/drain-to-substrate capacitances and/or low source/drain-to-substrate n+p junction breakdown voltages.

Indium is a p-type material from Group IIIA of the Periodic Table with an atomic weight of 114.82 as opposed to boron of the same Group IIIA having an atomic weight of 10.81. Indium therefore has a proportional decrease in its migration ability from its implant point. Indium can be implanted at a lower dosage and at a shallow depth necessary to overcome the problems with conventional high dosage boron implanted at deeper depths. Still further, indium can be easily substituted for boron using, for example, an indium bromide or indium chloride source material. Indium is implanted in a single step, and there is no need for modification of the field oxide growth chamber. Importantly, channel-stop implant of indium can be used in existing semiconductor fabrication equipment without additional processing steps and the disadvantages of conventional boron, boron/germanium and/or HIPOX.

Broadly speaking, the present invention contemplates a method for fabricating a semiconductor. The method comprises the steps of providing an opening to a field region of a semiconductor substrate upper surface. Indium ions are then implanted through the opening and into the field region. Next, a field oxide is grown upon the field region. The step of providing an opening to the field region comprises three substeps. First, a pad oxide is grown upon the substrate upper surface. Second, silicon nitride is deposited upon the pad oxide. Third, silicon nitride and pad oxide are selectively removed to produce the opening. The implanting step comprising ionizing elemental indium and placing the ions of indium into the field region at an exemplary dose less than or equal to $5 \times 10^{13}$ atoms/cm$^2$ at an implant energy greater than or equal to 200 keV. The exemplary placement depth at peak concentration is, therefore, approximately 950 Angstroms. The step of growing field oxide comprises subjecting the exposed field region to oxygen in a steam ambient at a temperature between 900° C. to 1100° C. for two to four hours. The resulting field oxide is grown to a thickness of 0.2 $\mu$m to 1.0 $\mu$m.

The present invention further contemplates a method for minimizing segregation and diffusion of dopant placed into field regions of a NMOS semiconductor device, comprising the steps of providing access to a field region at the upper surface of a semiconductor substrate. P-type ions are then inserted into the field region. The p-type ions are of larger atomic weight than boron and are inserted at a peak concentration dopant depth of, for example, 950 Angstroms relative to the upper surface with a $\Delta Rp$ of approximately 230 Angstroms. A field oxide is then grown upon the field region. Growing of field oxide consumes silicon at the upper surface of the semiconductor substrate to a depth shallower than the dopant depth. A gate oxide can then be grown in an active region adjacent to the field oxide region. Deposited upon the gate oxide is a polysilicon gate conductor which allows for self-aligned implanting of source and drain regions of n-type ions into the active region adjacent the implanted p-type ions. The polysilicon gate conductor and n-type implanted source and drain regions comprise an NMOS semiconductor device. The p-type ions are of a sufficient atomic weight so as to limit their segregation and movement from the field region into the active region during the growing of field oxide.

BRIEF DESCRIPTION OF THE DRAWINGS

Other objects and advantages of the invention will become apparent upon reading the following detailed description and upon reference to the accompanying drawings in which:

FIGS. 1–6 are cross-sectional views of a semiconductor substrate undergoing process steps of LOCOS and indium implant according to the present invention;

Figure 7:
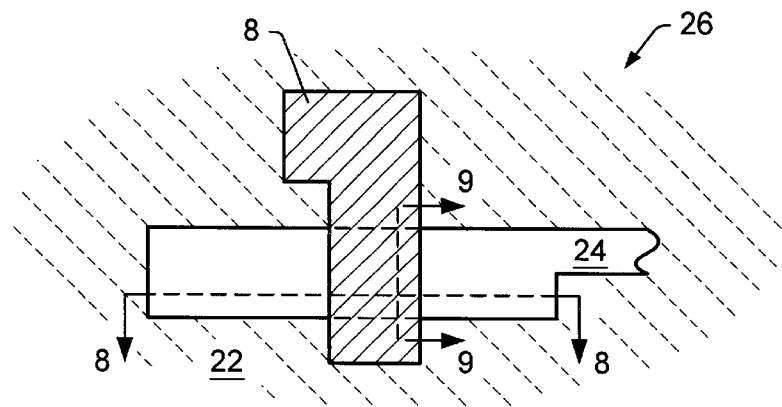
FIG. 7 is a top plan view of an MOS device embodying an active region and surrounding field region according to the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Referring now to FIG. 1, a cross-sectional view of a partial semiconductor substrate 10 is shown. Substrate 10 is preferably manufactured as p-type and has an upper surface upon which a pad-oxide layer 12 is placed. Pad oxide 12 is thermally grown on a pre-cleaned bare silicon surface to a thickness less than 100 nm. Preferably, pad oxide 12 is as thin as possible yet thick enough to cushion the transition of stresses between the substrate and the subsequently deposited nitride layer. In most cases, it is preferred that pad oxide 12 be at least 30 percent of the overlying nitride layer thickness.

FIG. 2 illustrates, in a subsequent step, silicon nitride layer 14 chemical vapor deposition (CVD) deposited upon pad oxide 12. Silicon nitride is assumed to oxidize at a fairly slow rate by one or both of the following reactions:

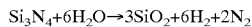

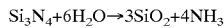

Oxygen and water vapor diffuse very slowly through silicon nitride preventing oxidizing species from reaching the silicon surface under the nitride. In addition, the nitride itself oxides very slowly as the field oxide is grown in a subsequent step. Silicon nitride films, however, exhibit high tensile stress thereby requiring an underlying pad oxide 12 to combat those stresses and avoid dislocation generation.

FIG. 3 illustrates a subsequent step needed to selectively remove nitride 14 and underlying pad oxide 12 leaving openings or access locations to underlying field regions 16. All other regions (or active regions) where active devices will be formed are covered or masked by the remaining pad oxide 12 and nitride 14. Non-patterned, initial nitride 14 and oxide 12 are removed in numerous ways according to photolithography steps. A resist layer is placed on the non-patterned nitride 14 and selectively exposed. Polymerized resist remains and non-polymerized resist is removed allowing openings to underlying, to-be-removed nitride 14 and oxide 12. Nitride and oxide can be etched used either wet etch or dry etch (plasma) process. A preferred etch having anisotropic capability is dry etch. Shown in FIG. 3 is resist layer 18 which remains on the non-removed nitride layer 14.

The resist layer 18 forms a barrier, along with nitride 14 against implantation of channel-stop ions into the underlying active region, as shown in FIG. 4. As such, p-type dopant ions of heavier atomic mass and weight than boron, and from Group IIIA are implanted into field regions (or channel-stop regions) 16. Indium ions, of atomic weight 115 are used as the channel-stop implant species. The ion implanter can utilize indium chloride or indium bromide as a vaporized source material. The ion implanter of indium ions can place the indium at an exemplary dose less than or equal to $5 \times 10^{13}$ atoms/cm$^2$ at an implant energy greater than or equal to 200 keV. The exemplary placement depth is approximately 950 Angstroms as measured at the concentration peak density of pre-implant. The above dosage, implant energy and concentration peak density range are merely exemplary values and can be varied depending upon desired application. For example, dosages can vary in order to adjust field threshold and/or source/drain-to-substrate capacitances or breakdown voltages. The parameters are varied in order to achieve a concentration peak density depth just below the field oxide which is formed in subsequent steps shown in FIGS. 5 and 6, and detailed below. Channel-stop implant 20 is therefore used to prevent inversion (channel formation) in the field oxide regions 16 so as to electrically isolate each MOS device.

Indium ions are p-type ions and are therefore used to provide channel-stop dopant 20 between active areas. Each active area is an NMOS device configured to receive n-type source/drain dopants (such as arsenic).

After channel-stop implant 20 is formed, field oxide 22 is thermally grown using a wet oxidation process. Suitable parameters for growing 0.2 μm to 1.0 μm field oxide 22 are provided in a steam ambient at a temperature between 900° C. to 1100° C. for two to four hours. During growth, field oxide 22 will extend perpendicular to substrate 10 upper surface as well as parallel (lateral) to the upper surface. Lateral growth of field oxide 22 causes it to grow under and lift the edges of nitride 14. Depending upon the thickness of pad oxide 12, more or less nitride 14 will be lifted, as shown in FIG. 5. Lateral extension of field oxide 22 is a well-known phenomenon often referred to as "bird's beak". Field oxide 22 is grown in a heated chamber after resist 18 is removed.

Field oxide 22 not only grows laterally but also grows perpendicular to the upper surface of substrate 10. Approximately two-thirds of field oxide 22 grows outward from the initial substrate upper surface and one-third of the ensuing oxide 22 extends into or consumes substrate 10. Thus, field oxide 22 remains slightly recessed but also extends outward from the substrate upper surface. Consumption of silicon within substrate 10 causes a large portion of the upper surface of field regions 16 to be consumed. Therefore, it is important that indium ions be implanted at a concentration peak density just below the lower extent of the ensuing oxide 22. As shown in FIG. 5, channel-stop dopant 20 peak concentration is preferably within 50 Angstroms below the lower boundary of field oxide 22. Suitable peak concentration range of 950 Angstroms therefore dictates a field oxide down to approximately 900–950 Angstroms below the silicon upper surface. By carefully controlling the implant species during the step shown in FIG. 4, channel-stop dopant 20 can be relatively thin and of light dosage for the advantages stated above. After field oxide 22 is grown, oxide-protecting nitride layer 14 as well as underlying pad oxide 12 is removed in the active region, designated as reference numeral 24. Active region 24 is then ready for subsequent photolithography steps necessary to produce an NMOS device.

Referring now to FIG. 7, an active device (doped as NMOS) is shown in a top plan view. MOS device 26 is formed according to the self-aligned process in which n-type dopant is introduced in active region 24 on opposite sides of a polysilicon gate 28. Surrounding active region 24 is field oxide 22 grown to the specified thickness described above.

Figure 8:
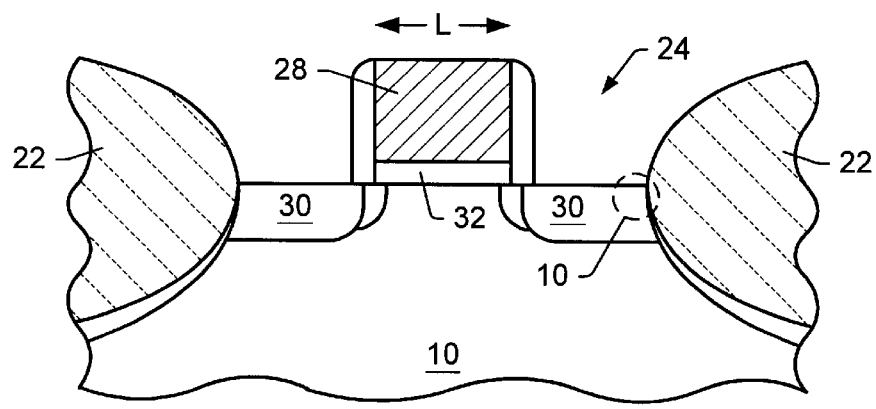
FIG. 8 is a cross-sectional view along plane 8—8 of FIG. 7.

Referring now to FIG. 8, a cross-sectional view of device 26 is shown along plane 8—8 of FIG. 7. Specifically, active region 24 of NMOS device 26 includes n-type source and drain regions 30. Source and drain regions 30 are implanted on opposite sides of polysilicon gate 28 and underlying gate oxide 32. Source and drain regions 30 are also implanted between polysilicon gate 28 and field oxides 22.

Figure 9:
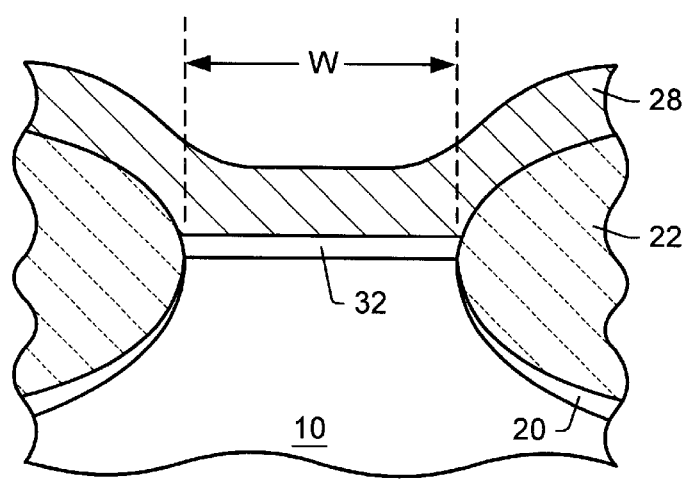
FIG. 9 is a cross-sectional view along plane 9—9 of FIG. 8.

Source and drain regions 30, in accordance with the self-aligned process are adjacent to channel-stop dopant 20. Thus, it is important that the p-type channel-stop dopant 20 not be allowed to laterally diffuse into the n-type source and drain regions 30. Any cross-diffusions can jeopardize the integrity of the source, drain and channel-stop regions. As shown in FIG. 9, any lateral diffusion into the active region from channel-stop dopant area 20 can cause a reduction in the gate width (W) of the NMOS device. Gate width is generally defined by the circuit designer to provide adequate drive of the active device. If the gate width decreases, drive capability will be reduced. Thus, it is important that channel-stop dopant 20 maintain its implanted position at the edge of field oxide 22. Any decrease in gate width caused by lateral diffusion of channel-stop dopant 20 can deleteriously effect the turn-on capacity and therefore the drive capability of the ensuing device.

Figure 10:
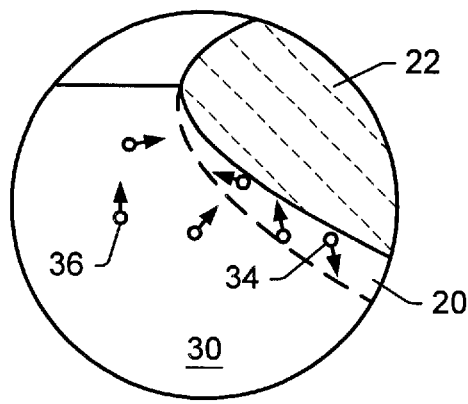
FIG. 10 is a partial atomic detailed view along area 10 of FIG. 8.

Referring now to FIG. 10, a detailed view along area 10 of FIG. 8 is shown. In particular, FIG. 10 illustrates atomic interaction of indium atoms 34 within channel-stop dopant region 20 and arsenic atoms 36 within source/drain region 30. Due to their large atomic weight, indium atoms 34 do not easily segregate and/or migrate through the silicon lattice to the adjoining source/drain region 30. Indium atoms are of larger atomic mass than the silicon atoms within the lattice and do not diffuse according to interstitial or substitutional movement mechanisms normally associated with diffusivity. Movement is very constrained along specific planes of the crystalline silicon lattice. Likewise, arsenic atoms are of larger atomic weight than the silicon atoms within the lattice and do not readily migrate from their source/drain region 30 to abutting channel-stop dopant region 20. Any migration which occurs is of fairly short diffusion length and is much shorter than boron diffusion length.

Figure 11:
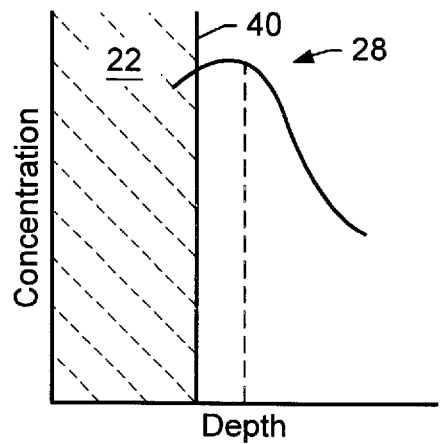
FIG. 11 is a graph of concentration density versus depth of indium implanted into the field region according to the present invention.
Figure 12:
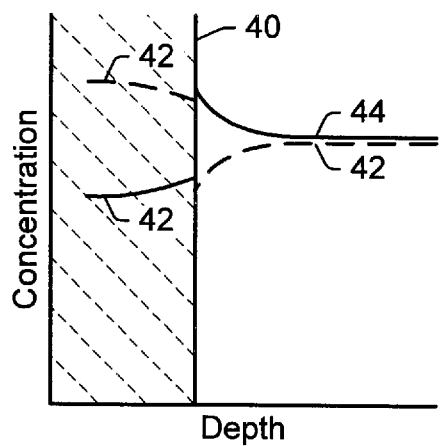
FIG. 12 is a graph of concentration density versus depth of indium in the field region after field oxide growth according to the present invention.

Referring to FIGS. 11 and 12, implant concentrations before and after field oxide growth, respectively, is shown. FIG. 11 illustrates a peak concentration density level 38 for the indium atoms implanted within field regions (channel-stop dopant regions). Concentration peak density 38 corresponds to a depth which is preferably less than 100 Angstroms below the lower boundary of the silicon consumed in the subsequent field oxide growth step. The lower boundary of field oxide is shown by reference numeral 40.

FIG. 12 illustrates that while oxide 22 is growing, silicon is being consumed and the impurities (such as p-type indium atoms) that were in the silicon are likely to be redistributed. The manner in which the distribution occurs depends upon the segregation coefficient of the indium impurity, oxidation enhanced diffusion from interstitial silicon injected from the grown oxide, and the relative diffusion coefficients of the impurity in silicon and in silicon dioxide. Segregation coefficient M is defined as the ratio of equilibrium concentration of impurity on the silicon side to that on the oxide side of the interface. As oxidation proceeds, the impurities can either be rejected by the oxide or depleted from the silicon to the oxide. Due to the high diffusivity coefficient and segregation coefficient of boron, boron has a tendency to become depleted from the silicon and built-up within the oxide area, as shown in phantom line 42. Thus, boron impurity concentration in the silicon just below field oxide 22 is depleted and must be counteracted by enhancing the implant dosage level. Increasing the dosage level of boron causes the problems described above and is to be avoided, if at all possible. Using indium instead of boron, and due to its lower diffusivity and segregation coefficient, allows for a rejection of indium atoms by the overlying field oxide 22, as shown by line 44. A build-up of indium ions just below field oxide lower surface 40 results from the advantages of using indium ions rather than boron. Not only can indium ions be more closely controlled and implanted due to their larger atomic weight to a concentration peak density just below lower edge 40, but also a build-up of indium ions naturally arises during the field oxide thermal cycle shown in FIG. 12. As such, indium ions can be implanted at a relatively light dosage, much less than boron, to achieve a tightly controlled, thin layer of indium ions just below the lower surface region 40. Lateral diffusion and deeper diffusion of indium ions can therefore be avoided.

It will be appreciated to those skilled in the art having the benefit of this disclosure that this invention is believed to be capable of NMOS applications which utilize a channel-stop dopant material in the field regions. It is also to be understood that the form of the invention shown and described is to be taken as a present preferred embodiment. Various modifications and changes may be made without departing from the spirit and scope of the invention as set forth in the claims. For example, modifications can be made to each and every processing step as would be obvious to a person skilled in the art having benefit of this disclosure, provided the modifications achieve the result set forth in the claims. It is therefore intended that the following claims be interpreted to embrace all such modifications and changes.

What is claimed is:

1. A method for fabricating an isolation structure upon and within a silicon substrate upper surface, comprising:

providing an opening to a field region of a silicon substrate upper surface;

implanting ions limited solely to indium through said opening and into said field region to a peak concentration density at an implant depth relative to the silicon substrate upper surface; and growing a field oxide upon said field region whereby the growing field oxide consumes the silicon substrate upper surface to a depth less than the implant depth.

2. The method as recited in claim 1, wherein said providing step comprises:

growing a pad oxide upon said substrate upper surface;

depositing silicon nitride upon said pad oxide; and selectively removing said silicon nitride and said pad oxide to produce said opening to the field region.

3. The method as recited in claim 1, wherein said implanting step comprises:

ionizing elemental indium; and placing said ions of indium into said field region at a dose less than $4 \times 10^{13}$ atoms/cm$^2$ at an implant energy greater than 200 keV, whereby the peak concentration depth is approximately 950 Angstroms.

4. The method as recited in claim 1, wherein said growing of field oxide step comprises subjecting said field region to oxygen in a steam ambient at a temperature between 900° C. to 1100° C. for 2 to 4 hours.

5. The method as recited in claim 1, wherein said field oxide is grown to a thickness of 0.3 μm to 1.0 μm.

6. A method for minimizing segregation and diffusion of dopant placed into field regions of an NMOS semiconductor device, comprising the steps of:

providing access to a field region at the upper surface of a silicon substrate;

inserting p-type ions limited solely to ions having a larger atomic weight than boron into said field region at a peak concentration dopant depth of approximately 950 Angstroms relative to said upper surface; and growing a field oxide upon said field region, wherein the growing said field oxide step consumes silicon at the upper surface of said silicon substrate to a depth substantially shallower than 950 Angstroms.

7. The method as recited in claim 6, further comprising. the steps of:

growing gate oxide in an active region adjacent said field region;

depositing a polysilicon gate conductor upon said gate oxide; and implanting source and drain regions of n-type ions into said active region adjacent the implanted said p-type ions, wherein the polysilicon gate conductor and n-type implanted source and drain regions comprise an NMOS semiconductor device.

8. The method as recited in claim 7, wherein said n-type ions are of lower atomic weight than said p-type ions.

9. The method as recited in claim 6, wherein said growing of field oxide step comprises subjecting said field region to oxygen in a steam ambient at a temperature between 900° C. to 1100° C. for 2 to 4 hours.

10. The method as recited in claim 6, wherein said p-type ions comprise indium ions.

11. The method as recited in claim 1, wherein said implanting step comprises:

ionizing elemental indium; and placing said ions of indium into said field region at a dose less than $4 \times 10^{13}$ atoms/cm$^2$ at an implant energy greater than 200 keV.

12. The method as recited in claim 6, wherein said providing step comprises:

growing a pad oxide upon the upper surface of said semiconductor substrate;

depositing silicon nitride upon said pad oxide; and selectively removing said silicon nitride and said pad oxide to produce said access to the field region.

13. A method for minimizing segregation and diffusion of dopant placed into field regions of an NMOS semiconductor device, comprising the steps of:

providing access to a field region at the upper surface of a silicon substrate;

inserting p-type ions limited solely to ions having a larger atomic weight than boron into said field region at a peak concentration dopant depth of approximately 950 Angstroms relative to said upper surface;

growing a field oxide upon said field region, wherein the growing of said field oxide step consumes silicon at the upper surface of said silicon substrate to a depth shallower than 950 Angstroms;

growing a gate oxide in an active region adjacent said field region;

depositing a polysilicon gate conductor upon said gate oxide; and implanting source and drain regions of n-type ions into said active region adjacent the implanted said p-type ions, wherein the polysilicon gate conductor and the n-type implanted source and drain regions comprise an NMOS semiconductor device, and wherein said p-type ions are of sufficient atomic weight so as to limit their segregation and movement from said field region to said source and drain regions during said growing of field oxide step.

14. The method as recited in claim 13, wherein said n-type ions are of lower atomic weight than said p-type ions.

15. The method as recited in claim 13, wherein said p-type ions comprise indium ions.

* * * * *